United States Patent
Langer et al.

(10) Patent No.: US 12,088,285 B2
(45) Date of Patent: Sep. 10, 2024

(54) IC THERMAL PROTECTION

(71) Applicant: Microchip Technology Inc., Chandler, AZ (US)

(72) Inventors: Tamir Langer, Tel Aviv (IL); Migel Jacubovski, Hod HaSharon (IL)

(73) Assignee: Microchip Technology Inc., Chandler, AZ (US)

( * ) Notice: Subject to any disclaimer, the term of this patent is extended or adjusted under 35 U.S.C. 154(b) by 443 days.

(21) Appl. No.: 17/548,988

(22) Filed: Dec. 13, 2021

(65) Prior Publication Data

US 2022/0294439 A1   Sep. 15, 2022

Related U.S. Application Data

(60) Provisional application No. 63/159,510, filed on Mar. 11, 2021.

(51) Int. Cl.
| | |
|---|---|
| *H03K 17/082* | (2006.01) |
| *G01K 7/01* | (2006.01) |
| *H02H 5/04* | (2006.01) |
| *H03K 17/08* | (2006.01) |

(52) U.S. Cl.
CPC ........... *H03K 17/0822* (2013.01); *G01K 7/01* (2013.01); *H02H 5/044* (2013.01); *H03K 2017/0806* (2013.01)

(58) Field of Classification Search
CPC ....... H03K 2017/0806; H03K 17/0822; H02H 5/04–048
See application file for complete search history.

(56) References Cited

U.S. PATENT DOCUMENTS

| | | | |
|---|---|---|---|
| 7,507,023 B2 | 3/2009 | Oyabe et al. | |
| 10,848,175 B2 | 11/2020 | Doorenbos et al. | |
| 2007/0126619 A1 | 6/2007 | McGrath | |
| 2008/0043393 A1* | 2/2008 | Petkov | H02H 5/041 361/103 |
| 2015/0270254 A1 | 9/2015 | Risbud | |
| 2021/0172808 A1* | 6/2021 | Poirier | G01K 7/01 |

OTHER PUBLICATIONS

PCT/US2022/011022, International Search Report and Written Opinion, European Patent Office, mailed Apr. 12, 2022.

* cited by examiner

*Primary Examiner* — Jared Fureman
*Assistant Examiner* — Christopher J Clark
(74) *Attorney, Agent, or Firm* — Glass & Associates; Kenneth Glass; Larry Goerke

(57) ABSTRACT

A method provides thermal protection for an IC device that has multiple components. For each component, temperatures are sensed, each of which associated with a different area of the respective component and a respective temperature sense signal is output indicative of the highest sensed temperature of the respective component. For each of the components, the respective temperature sense output signal is sampled to produce a sequence of discrete sampled temperature values. A sequence of differences between a reference temperature value and each of the discrete sample temperatures is integrated over time to compute, for each of the components, a respective integration output. The respective integration output computed for each of the switches is compared to a threshold value. An action related to the thermal protection function is initiated upon the integration output of an affected component exceeding the threshold value.

24 Claims, 10 Drawing Sheets

500

510 For each component of an IC device, sense a plurality of temperatures, each associated with a different area of the respective component, and output, for each of the components, an indication of the highest sensed temperature of the plurality of sensed temperatures

520 For each of the components, the temperature output signal is sampled over each of a plurality of sequential instants to produce a sequence of discrete sampled temperature values

530 Integrate, over time, a sequence of differences between a reference temperature value and each of the discrete sample temperatures to compute an integral for each of the one or more components

540 Compare Integral to Threshold:

*Meets or Exceeds Threshold*  *Below Threshold*

550 Feed back to the Step '510'

560 Initiate an action related to the thermal protection function upon the integration output exceeding a threshold (shutting down a port of the IC device corresponding to the components for which the integral has met or exceed the threshold, which is placed into a substantially non-conductive state)

*FIG. 5*

IC THERMAL PROTECTION

RELATED APPLICATIONS

The present Application claims the benefit under 35 U.S.C. § 119 of the priority date of U.S. Provisional Patent Application Ser. No. 63/159,510 filed on Mar. 11, 2021, the entire contents of which are incorporated by reference as if fully set forth herein.

TECHNOLOGY

The present disclosure relates generally to Integrated Circuits. More particularly, the present disclosure relates to providing thermal protection for an Integrated Circuit (IC).

BACKGROUND

Integrated Circuits (ICs) find utility in modern applications that are so numerous as to have become almost ubiquitous in networking and communication, information processing, power handling, transport and virtually any other field, endeavor, enterprise or the like in which electronics can be used. The ICs, also called "chips," typically have a number of transistors and other electronically active devices, known simply as "active devices." The active devices can be disposed or configured within a semiconductor medium such as Silicon (Si), Germanium (Ge) and/or other elements or substances. The transistors can typically be combined with electronically passive devices, known simply as "passive devices," such as resistors, capacitors, inductors, and/or other components. The transistors (and other active devices and passive devices) therein can be interconnected with various conductors them. The transistors can provide many functions, including the functions of a switch, in which case the transistor can simply be called a switch.

During normal operation of the IC, its active components such as transistors (and other, e.g., passive components; perhaps less significantly relative to the active components) consume power, e.g., electrically, and produce heat. Other than normal operations of the IC, operations can include powerups (successful and unsuccessful) and charging of pure (and other than pure) capacitive loads related thereto, power inrushes (which can, e.g., be associated with powerups and charging), overloads, and short circuits. Operations, other than normal IC operations, can span various durations and during such other than normal operations the IC heat production can increase, perhaps significantly. The production of heat during any operation of the IC can affect the performance thereof, and overheating the IC can cause thermal damage thereto.

SUMMARY OF INVENTION

An example implementation relates to a method of providing a thermal protection function for an integrated circuit (IC) device that comprises a plurality of components. The method includes sensing one or more temperatures for each of the plurality of components. Each of the one or more temperatures is associated with a different area of the respective component. A respective temperature sense signal is output for each of the plurality of components, which is indicative of the highest sensed temperature of the plurality of sensed temperatures of the respective component. The respective temperature sense output signal for each of the components is sampled to produce a sequence of discrete sampled temperature values. A sequence of differences between a reference temperature value and each of the discrete sample temperatures is integrated over time to compute, for each of the components, a respective integration output. The respective integration output computed for each of the switches is compared to a threshold value. An action related to the thermal protection function is initiated upon the integration output of an affected one of the components exceeding the threshold value.

In an example implementation, the method includes computing the sequence of differences between the reference temperature value and each of the discrete sample temperatures.

In an example implementation, the method includes filtering at least one of the discrete sampled temperature values and the sequence of differences between the reference temperature value and each of the discrete sample temperatures.

In an example implementation, the filtering includes filtering the discrete sampled temperature values by an integrate-and-dump function. In an example implementation, the filtering includes filtering the sequence of differences between the reference temperature value and each of the discrete sample temperatures by computing a moving average.

In an example implementation, the integration of the sequence of differences includes computing a product of the sequence of differences between the reference temperature value and each of the discrete sample temperatures, and a gain factor. The computed product is integrated over time, to thereby integrate the sequence of differences between the reference temperature value and each of the discrete sample temperatures.

In an example implementation, the method includes selecting the gain factor from at least two configurable gain factors. In an example implementation, the at least two configurable gain factors include a first gain factor selected in relation to a normal operation of the IC device, and a second gain factor selected in relation to an other than normal operation of the IC device. The second gain factor is greater than the first gain factor. In an alternative or additional implementation, the switches of the IC device are forced into a substantially nonconductive 'off' state directly when a second reference point is reached or crossed.

In an example implementation, the plurality of components includes power MOSFET switches. The thermal protective action taken relates to placing the affected power MOSFET switch into a substantially non-conductive state.

An example implementation relates to a system operable in relation to a thermal protection function for an integrated circuit (IC) device, which includes a plurality of components. The system includes an array of temperature sensors disposed within each of the plurality of components to sense, for each of the components, one or more temperatures. Each of the temperatures is associated with a different area of a respective component. The array of temperature sensors outputs, for each of the components a temperature sense output signal indicative of the highest sensed temperature of the plurality of sensed temperatures. A sampler is coupled to the array of temperature sensors. The sampler is operable to sample, for each of the one or more components, the temperature sense output signal to produce a sequence of discrete sampled temperature values. An integrator is operable to integrate, over time, a sequence of differences between a reference temperature value and each of the discrete sample temperature values to compute an integration output for each of the components. An actuator is operable to compare the integration output computed for each of the components to a threshold value. Upon the integration output of an affected one of the components switches exceeding the threshold value, the actuator places the affected component into a substantially non-conductive state.

In an example implementation, the system includes a subtractor disposed between the sampler and the integrator to compute the sequence of differences between the reference temperature value and each of the discrete sample temperatures.

In an example implementation, the method includes an integrate-and-dump filter coupled to the sampler and the subtractor to filter the sampled temperature output signal in relation to an integrate-and-dump function.

In an example implementation, the system includes a moving average filter coupled to the subtractor and operable to filter the sequence of temperature differences in relation to computing a moving average value thereof.

In an example implementation, the system includes a filter bank to filter at least one of the sequence of discrete sampled temperature values and the sequence of differences between the reference temperature value and each of the discrete sample temperatures. In an example implementation, the filter bank includes one or more of the moving average filter or the integrate-and-dump filter.

In an example implementation, the system includes a multiplier coupled to the integrator and operable with a gain factor, to compute a product of the sequence of differences between the reference temperature value and each of the discrete sampled temperature values and the gain factor, wherein the integration over time of the sequence of differences is of the computed product.

In an example implementation, the system includes a configurable gain block coupled to the multiplier and operable to store at least two configurable gain factors, which are selectively readable by the multiplier.

In an example implementation, the at least two configurable gain factors include a first and a second gain factor. The first gain factor is selected in relation to a normal operation of the IC device. The second gain factor is selected in relation to an other than normal operation of the IC device. The second gain factor is greater than the first gain factor.

An example implementation relates to an integrated circuit (IC) device. The IC device includes a semiconductor die. An active area is disposed upon the die and includes one or more Powe Metal Oxide Semiconductor Field Effect Transistor (Power MOSFET) based switches. An array of temperature sensors is disposed within each of the Power MOSFET based switches to sense a temperature of the switch in proximity thereto, and to output a temperature sense output signal corresponding to a highest temperature sensed within the switch. A control unit is disposed upon the die, coupled to the temperature sensor array and operable to control each of the switches in relation to the allowing of the flow of electrical power through the IC device and to provide a thermal protection function related thereto.

The control unit includes a sampler, an integrator and an actuator. The sampler is coupled to the array of temperature sensors to sample, for each of the one or more switches, the temperature output signal to produce a sequence of discrete sampled temperature values. The integrator integrates, over time, a sequence of differences between a reference temperature value and each of the discrete sample temperatures to compute an integration output for each of the switches. The actuator compares the integration output computed for each of the switches to a threshold value. Upon the integration output of an affected one of the switches exceeding the threshold value, the actuator initiates an action related to the thermal protection function, wherein a port of the IC device corresponding to the affected switch is shut down by placing the affected switch into a substantially non-conductive state.

In an example implementation, the control unit includes a subtractor disposed between the sampler and the integrator. The subtractor is operable to compute the sequence of differences between the reference temperature value and each of the discrete sample temperatures.

In an example implementation, the control unit includes an integrate-and-dump filter coupled to the sampler and the subtractor. In an example implementation, the control unit includes a moving average filter coupled to the subtractor and operable to filter the sequence of temperature differences in relation to computing a moving average value thereof.

In an example implementation, the control unit includes a multiplier coupled to the integrator and a gain block and operable with a gain factor readable therefrom, the multiplier to compute a product of the sequence of differences between the reference temperature value and each of the discrete sampled temperature values and the gain factor wherein the integrator to integrate, over time, the computed product to compute the integrated output.

In an example implementation, the gain block is configurable and coupled to the multiplier. The gain block stores at least two configurable gain factors, which are selectively readable by the multiplier.

In an example implementation, the at least two configurable gain factors include a first gain factor and a second gain factor. The first gain factor is selected in relation to a normal operation of the IC device. The second gain factor is selected in relation to an other than normal operation of the IC device. The second gain factor is greater than the first gain factor.

In an example implementation, the control unit includes a moving average filter disposed in a filter bank to filter the sequence of temperature differences in relation to computing a moving average value thereof. In an example implementation, the filter bank also includes the integrate-and-dump filter.

BRIEF DESCRIPTION OF THE DRAWINGS

Some illustrative aspects, features and elements related to example implementations of the present disclosure are described herein with reference to the following description and drawings. Various ways in which the principles disclosed herein are practically implementable are thus described, and all aspects and equivalents thereof are intended to fall within the scope of the claimed subject matter. The foregoing, and other features and uses of the present disclosure, become more apparent in view of the following description in conjunction with each enumerated figure (FIG.) of the accompanying drawings. Throughout the specification of the present disclosure, the like reference numerals (as shown in each FIG. of the drawings) generally refer to the like components, features and/or elements. In the drawing figures, therefore:

FIG. 5 is a flowchart of an example method for implementing thermal protection for an IC device;

DISCLOSURE OF INVENTION

Figure 1:
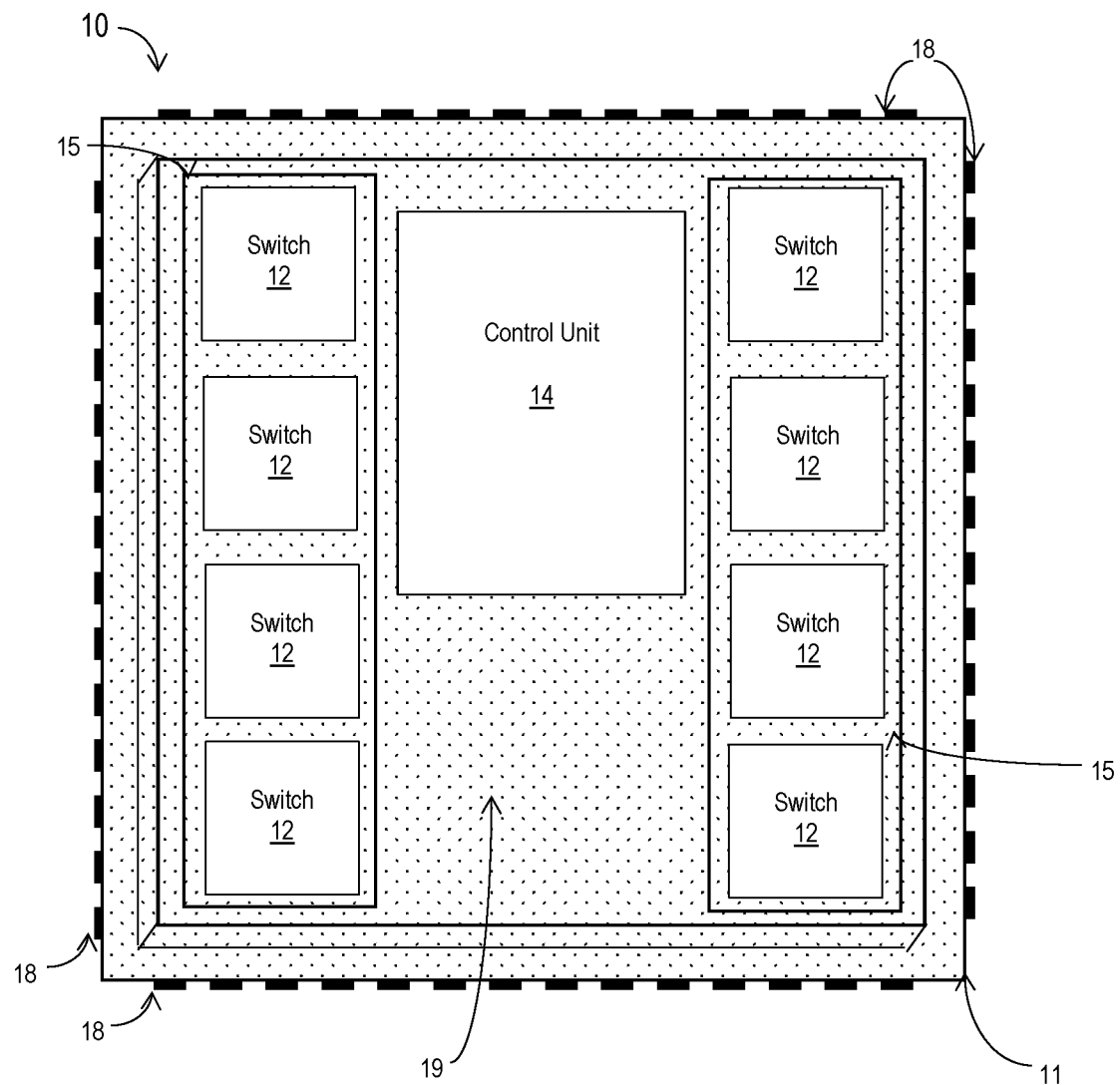
FIG. 1 depicts an example of an IC device implementation.

Examples of the present disclosure are described below in relation to IC thermal protection, and in somewhat more detail with reference to each FIG. of the accompanying drawings. Although the accompanying drawings show examples of the present disclosure, it should be understood that the present disclosure is implementable in various forms and should not be limited by the examples described herein. Instead, these examples are provided so that the present disclosure is better understood, and the scope of the present disclosure fully conveyed to artisans of ordinary skill in related technologies.

Overview

An integrated circuit (IC) device has one or more components for which thermal protection may be desired. In one example the components are switches. Each of the one or more switches includes a Power Metal Oxide Semiconductor Field Effect Transistor (Power-MOSFET). The Power-MOSFET is comprised of multiple fingers. Thus, the term switches, as used herein, refers to the Power-MOSFET. In one particular example, each of the switches functions as a port of the IC device. Each of the switches is thus operable, upon being gated into a conductive state, to conduct an electrical current into or out of the IC device.

An example implementation relates to a method of providing a thermal protection function for an integrated circuit (IC) device comprising a plurality of components. In one example the components are switches, and the description will utilize this example for illustration, without being limited to switches. For each of the switches, one or more temperatures are sensed. Each of the one or more temperatures are associated with a different area of the respective switch. A temperature sense output signal for each of the one or more switches indicates the highest sensed temperature of the plurality of sensed temperatures. For each of the switches, the temperature sense output signal is sampled over each of a plurality of sequential instants to produce a sequence of discrete sampled temperature values. For each of the switches, a sequence of differences is computed between a reference temperature value and each of the discrete sampled temperature values. The sequence of differences is integrated over time to compute a respective integral for each of the switches. For each of the switches, the computed integral is compared with a threshold value. Upon the computed integral exceeding the threshold value for one of the switches, an action is initiated to open the affected switch, so as to place into a substantially non-conductive state.

Example implementations relate to a system and method for providing thermal protection for an IC device. An example implementation relates to an IC device having a system and/or components, units and/or elements thereof, which are operable for providing thermal protection for the IC device. Various example implementations are described below, with reference to each FIG. of the referenced drawings.

Example IC Device Platform

FIG. 1 depicts an IC device 10, in an example implementation. The IC device 10 has a semiconductor die foundation 11, which is formed from a semiconductor material such as Si or Ge. One or more active areas 15 each have one of more switches 12, which as indicated above are simple examples of components for which thermal protection is desired.

Each of the switches 12 functions as a port of the IC device 10. Each of the switches 12 is thus operable, upon being gated into a conductive state, to conduct an electrical current into and/or out of the IC device 10. Each of the switches 12 includes a Power MOSFET. In one example, the respective Power MOSFETs each are comprised of multiple fingers connected in parallel thus forming the Power MOSFET.

The IC device 10 is useful in any application typically associated with integrated circuits (ICs). In an example implementation, the IC device 10 is operable in relation to a 'Power over Ethernet' (PoE) application, such as Power Sourcing Equipment (PSE) and/or a Powered Device (PD), e.g., related thereto.

In an example implementation, the IC device 10 has a plurality of conductive (e.g., metallic) pins, balls, or other structures ("pins") 18, with which a component of the IC device 10 is coupled electrically, e.g., to a printed circuit board (PCB), a component thereof, or the like. The active (and passive) components of the IC device 10 are interconnected, and/or coupled to the conductive structures 18, over a fabric, network and/or pattern of conductors 19.

The conductors 19 include electrically conductive horizontal "traces" and/or vertical vias (also known, e.g., as "VIAs," or Vertical Interconnect Accessways). As used in the instant sense, the terms "horizontal" and "vertical" each refer to an orientation corresponding to individual planes, which are disposed orthogonally in relation to each other (and/or without a specific orientation relative to any particular observer, an outside reference position, or other specific cardinal, ordinal or radial direction).

The IC device 10 has a control unit 14. The control unit 14 is operable for controlling one or more functions of the IC device 10, including thermal protection thereof, as well as gating the switches 12 in relation to their conductive state. The control unit 14 is coupled communicatively over the conductors 19 with switches 12 therein, e.g., for exercising a control function associated therewith.

In an example implementation, the control function relates to the thermal protection of the IC device 10, and the conductivity state of its switches 12. The conductors 19 electrically couple and/or interconnect components, units, and other elements of an example thermal protection system described herein (e.g., system 300; described below with reference to FIG. 3 and FIG. 4) and are operable to conduct signals, outputs, inputs and power to, from and/or between them.

In an example implementation, the IC device 10 is operable as a PSE IC or a PD IC. In a PoE application, the switches 12 each potentially service power usage of up to several tens of Watts (e.g., 45 W).

In an example implementation, the switches 12 are in one embodiment characterized with a low, total on-state, source-to-drain port resistance ($RDS_{ON}$), such as resistance values well below approximately (approx.) 600 Milliohms (e.g., $RDS_{ON} \leq 600$ mΩ). The low $RDS_{ON}$ of switches 12 helps mitigate steady-state self-heating of the IC device 10.

The IC device 10 is designed for efficient normal operation at temperatures of below approximately 150 degrees Celsius (e.g., ≤135° C.). Notwithstanding these particular efficiencies however, the IC device 10 is implemented so as to sustain and withstand high peak transient temperatures. The peak transient temperatures potentially relate to transient power states, which include (but are not limited to) in-rush currents (and current limitation thereof), current-limiting modes of operation, and/or fault conditions, such as short circuits.

In operation, when performing a PoE application, thermal behavior of the IC device 10 is potentially characterized by heightened levels of transient thermal stress during power-up and/or temporary overload conditions, short circuits and other faults. Peak temperatures associated with junction temperatures of power MOSFETs, which form each of the switches 12, are potentially expected to reach, or exceed, certain thermal thresholds in relation to the IC capabilities during some such conditions.

The duration of various transient thermal stress scenarios may vary in relation to causes thereof. For example, a thermal stress scenario associated with a short circuit causes peak temperatures within an affected one of the switches 12 that potentially reaches or exceed 150° C. for up to approximately 100 microseconds (μs) or more. In contrast, a thermal stress scenario associated with a current in-rush phase causes peak temperatures within one of the switches 12 that potentially reach or exceed, 150° C. for longer periods, e.g., on the order of 50-75 milliseconds.

The PoE applications for which the IC device 10 is operable are described herein strictly by way of example and are not to be considered as delimiting its usefulness in any way. On the contrary, it is to be understood from the present specification that the IC device 10 is useful in virtually any other application as well for which IC devices are typically employed.

Example implementations described herein relate to thermal protection of the IC device 10, which helps protect against overheating during both normal operations and some other than normal operations, such as those having relatively brief durations and/or lower intensities. The examples described herein relate to thermal protection of the IC device 10 that help to deter, mitigate and/or prevent thermal damage thereto due to overheating, which are potentially associated with other than normal operations of longer durations and/or intensities such as sustained overloads and/or faults such as short circuits.

Example Temperature Sensors

Figure 2A:
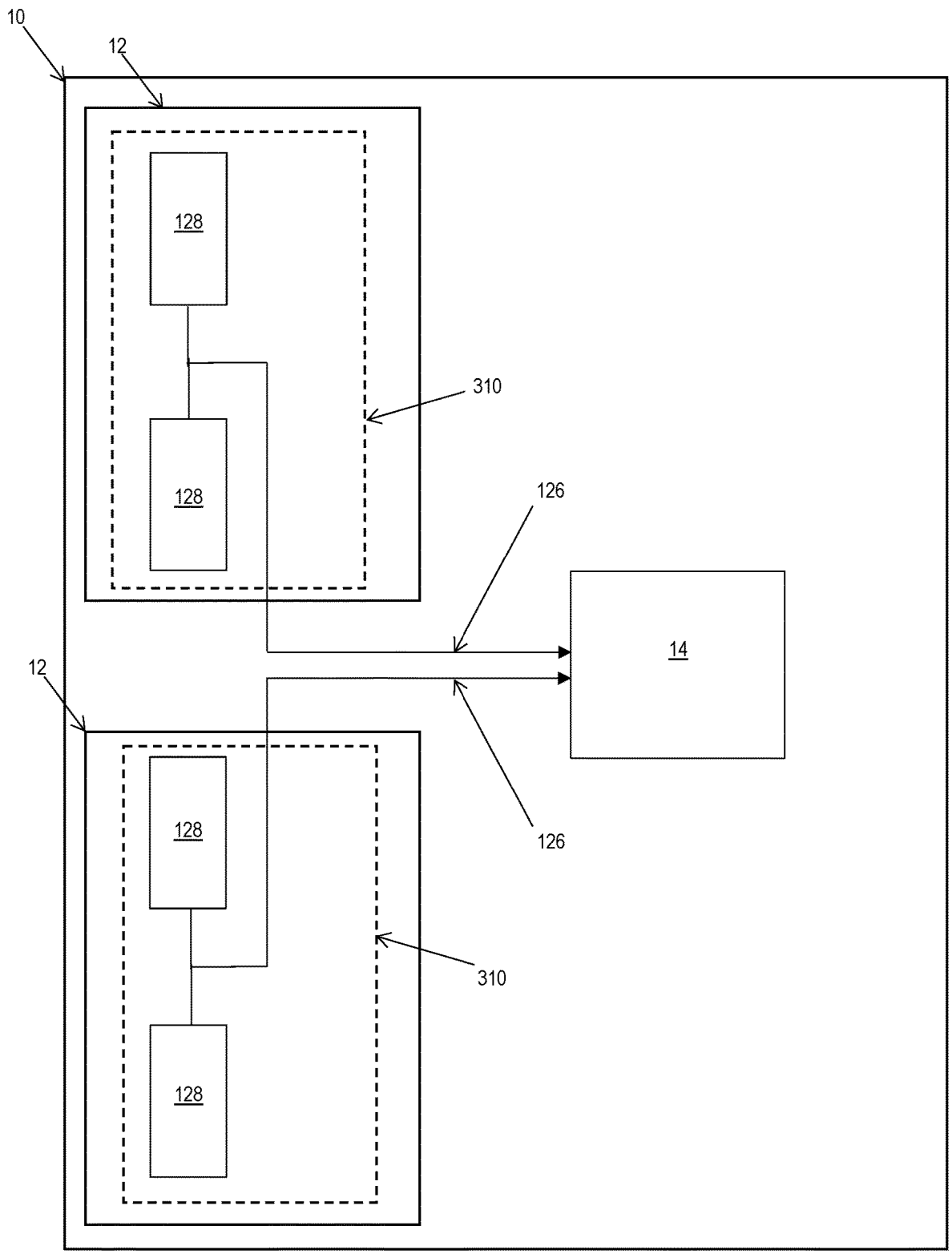
FIG. 2A depicts an example portion of the IC device.

A portion of the IC device 10 shown in FIG. 2A has a pair of the switches 12. Each of the switches 12 has an array 310 of temperature sensors. The array 310 of each switch 12 has at least one temperature sensor 128. In an example in which at least a pair of the temperature sensors 128 are provided for each array 310, the pair of temperature sensors 128 are coupled in parallel. Each of the temperature sensors 128 senses the temperature most effectively in the area proximate to its position within the switch 12.

In a non-limiting example, thermal diodes implement the temperature sensors 128, which are supplied with a fixed current from the control unit 14. Each of the temperature sensors 128 develops an individual voltage corresponding to the temperature sensed therewith. As each pair of the temperature sensors 128 are coupled in parallel, the lower of the voltages developed by either corresponds to the highest temperature sensed by the array 310 in which they are disposed.

The voltage functions as a respective temperature sense output signal 126 from each of the arrays 310. In an example implementation, the temperature sense output signals 126 from each of the switches 12 are multiplexed for supply to the control unit 14. However, the control unit 14 reads the voltage from each of the arrays 310 individually. The control unit is thus operable to process the temperature sense output signal 126 from each of the switches 12 independently, e.g., as described with reference to FIG. 3, below.

Figure 2B:
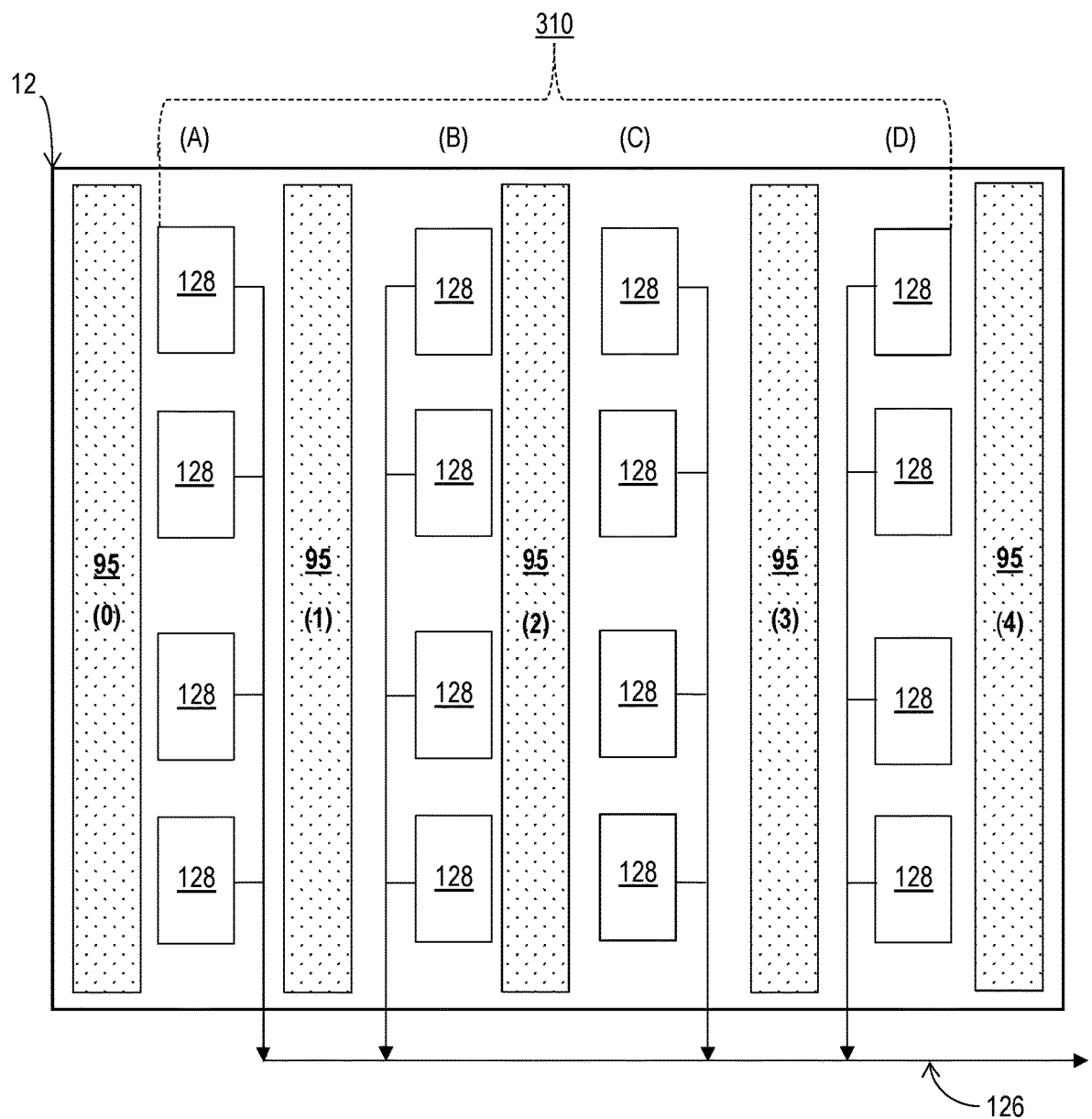
FIG. 2B depicts an example implementation of the switch.

FIG. 2B depicts an example implementation of a switch 12. As shown in FIG. 2B, the implementation of the switch 12 includes five parallel fingers 95, respectively labelled '0', '1', '2', '3', '4' and '5', which together form a power MOSFET, i.e., switch 12. The switch 12 has an array 310, which includes a plurality of temperature sensors 128 disposed over four parallel columns 'A', 'B', 'C' and 'D'. The example is not meant to be limiting in any way, and more, or less fingers, in a plurality of shapes and arrangements may be provided without exceeding the scope. Other arrangements of FETs, arranged to form a power MOSFET may also be utilized without exceeding the scope. For example, finger 2 may be replaced with a pad to connect the switch 12 to other circuitry of the IC device 10. Similarly, a single column of temperature sensors 128 may be in proximity to each finger, or temperature sensor 128 may be arranged in any geometric pattern to form array 310, each temperature sensor 128 arranged to sense the temperature of a particular area of switch 12 without exceeding the scope.

The column A of the temperature sensors 128 is disposed in a line between the fingers 95(0) and 95(1) and temperature sensors 128 of column A are coupled in parallel with each other. The column A of the temperature sensors 128 are each operable to sense the temperature in the area of the switch 12 between the MOSFET fingers 95(0) and 95(1) in closest proximity to the position in which they are disposed (with greater efficiency, relative to the other sensors).

The column B of the temperature sensors 128 is disposed in a line between the fingers 95(1) and 95(2) and temperature sensors 128 of column B are coupled in parallel with each other. The column B of the temperature sensors 128 are each operable to sense the temperature in the area of the switch 12 between the fingers 95(1) and 95(2) in closest proximity to the position in which they are disposed (with greater efficiency, relative to the other sensors).

The column C of the temperature sensors 128 is disposed in a line between the fingers 95 (2) and 95(3) and temperature sensors 128 of column C are coupled in parallel with each other. The column C of the temperature sensors 128 are each operable to sense the temperature in the area of the switch 12 between the fingers 95(2) and 95(3) in closest proximity to the position in which they are disposed (with greater efficiency, relative to the other sensors).

The column D of the temperature sensors 128 is disposed in a line between the fingers 95(3) and 95(4) and temperature sensors 128 of column D are coupled in parallel with each other. The column D of the temperature sensors 128 are each operable for sensing the temperature in the area of the switch 12 between the fingers 95(3) and 95(4) in closest proximity to the position in which they are disposed (with greater efficiency, relative to the other sensors).

The temperature sensors 128 in each of the columns A, B, C and D are coupled electrically in parallel, and each of the columns A, B, C and D of the array 310 are coupled in parallel. In an example implementation, the temperature sense output signal 126 from the array 310 thus corresponds to the highest temperature sensed in the switch 12, in which the array 310 is disposed.

Example System

Figure 3:
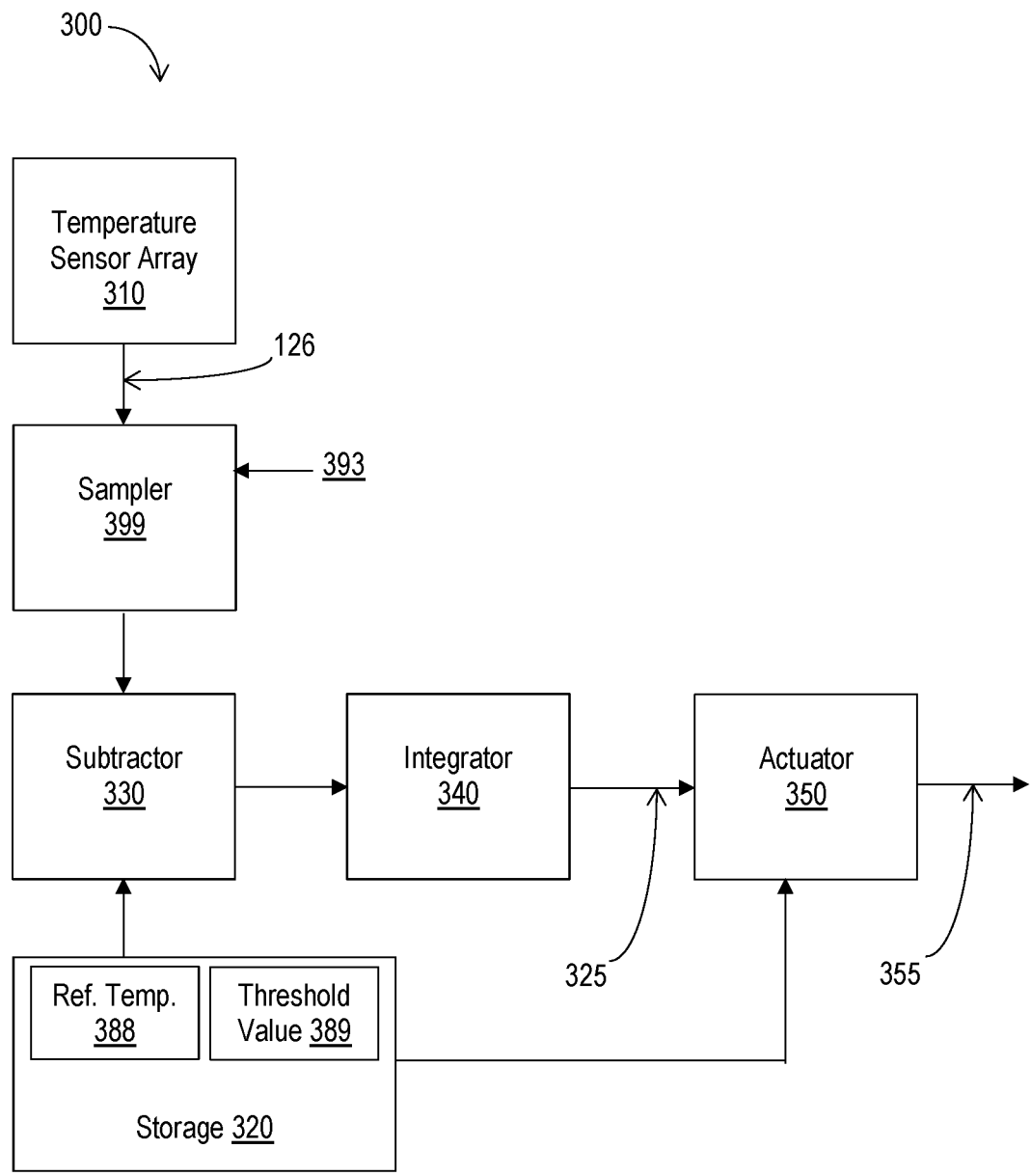
FIG. 3 depicts an example thermal protection system for the IC device.

An example implementation relates to a system operable in relation to a thermal protection function for an IC device, which has one or more components, such as switches, which switches may constitute power MOSFETs. FIG. 3 depicts an implementation of an example thermal protection system 300 for the IC device 10. The operations of the thermal protection system 300 are performed independently in relation to each of the switches 12 of the IC device 10.

The thermal protection system 300 includes array 310, disposed in each of the switches 12 of the IC device 10, as described above in relation to FIGS. 2A-2B. In an example implementation, the temperature sensor array 310 has at least one temperature sensor within each of the switches 12. In another example implementation, the temperature sensor array 310 has a plurality of the temperature sensors arranged within each of the switches 12 among a plurality of fingers thereof, or arranged in an appropriate geometric pattern to sense the temperature of a plurality of areas of switch 12.

The sensor array 310 is operable to sense, for each of the switches 12, one or more temperatures. Each of the one or more temperatures is associated with a different area of the respective switch 12. For each of the one or more switches 12, the array outputs an indication of the highest sensed temperature of the plurality of sensed temperatures. In an example implementation, sensing the temperature of the switch 12 relates to a junction temperature of the fingers thereof, or of constituent FETs in the fingers.

Each of the arrays 310 provides a temperature sense output signal 126, based on the highest temperature sensed in the switch 12 in which it is disposed. In an example implementation, the temperature sense output signal 126 relates to a voltage level based on the temperature sensed by the temperature sensors 128 of the array 310. The thermal protection system 300 processes an individual temperature sense output signal 126 from each of the switches 12 independently.

The thermal protection system 300 has a sampler 399 coupled to the array 310. The sampler is operable to sample, for each of the switches, the temperature sense output signal 126 over each of a plurality of sequential instants to produce a sequence of discrete sampled temperature values. In an example, the sampler 399 is implemented as an analog to digital converter (ADC), responsive to a periodic trigger signal 393. The sampler 399 samples the temperature sense output signal 126 from the array 310 of each of the switches 12 independently, relative to each of the others. In one example, a plurality of samplers 399 are provided, one for each array 310, and in another example a multiplexer is provided, with each of the respective temperature sense output signals 126 being time multiplexed to sampler 399.

The temperature output signal 126 is sampled by sampler 399 at a preset or configurable sampling rate.

The system 300 has at least one processing component, such as subtractor 330, which is coupled to the sampler 399. The at least one processing component is operable, for example, for processing the sequence of discrete sampled temperature values. Implemented as the subtractor 330 for example, the processing relates to computing a subtraction operation therewith. In an example implementation, the at least one processing component is operable for subtracting a reference temperature value from each of the discrete sample temperatures to compute a corresponding sequence of temperature differences and thus functions as the subtractor 330. In an example implementation, the reference temperature value 388 is accessed by the subtractor 330 from a readable, persistent and/or tangible storage medium 320, which is coupled thereto.

Subtractor 330 may be disposed in a variety of positions within the system 300, such as between the sampler 399 and an integrator 340, as described below. Another relevant example is described further with reference to FIG. 4, below.

The subtractor 330 thus computes a difference between each sampled temperature sense output signal 126 and the reference temperature value 388 and outputs a difference signal. The output difference signal, which may be a digital signal, or an analog signal, reflects the computed difference from the reference temperature value 388 for each of the samples of the temperature sense output signal 126.

The system includes an integrator 340 coupled to the subtractor 330. The integrator 340 is operable to integrate, over time, the difference signal, i.e., a sequence of temperature differences between the reference temperature value 388 and each of the discrete sample temperature sense output signal 126. The integrator 340 thus computes an integral for each of the switches 12.

The integrator 340 is thus operable to receive the output difference signal, and compute an integration of each of the temperature differences with respect to time, and provide an integrated output 325 corresponding to the integrated differences.

In an example implementation, the integrating component 340 computes the integrated output 325 according to the Equation 1, below.

$$y(t) = k \int_0^t (T(\tau) - T_{REF}) d\tau \quad \text{(Equation 1)}$$

In the Equation 1, the terms: 'y(t)' represents the integrated output 325, computed with respect to time from a first time zero ('0') through a last "present" time 't'. The integral is computed over the differences between a temperature sense output signal 126 sampled at a time τ, denoted 'T(τ)' and related to a switch 12, and a reference temperature value '$T_{REF}$', i.e., the reference temperature value 388, the differences determined at each discrete point in time, based on the sample rate, over a finite time period spanning the first time 0 through the present time t. In the Equation 1, the term 'k' represents a configurable gain function, with which the integral is multiplied. The gain function is discussed with reference to FIG. 4, below.

In an example implementation, the integrator 340 performs its operations continuously, and without resetting. Thus, an example implementation averages episodes of both cooling down and heating up over the time τ. To maintain clarity, the symbol 'τ' (small case Greek letter 'Tau') is used inside the integral shown above in Eq. 1 to represent the time period and represents the variable of integration. In an alternative implementation, the integrator 340 is periodically reset.

Design specifications of the IC device 10 identify energy levels and corresponding temperatures of the switches 12 in relation to various operational conditions. The design specifications of the switches 12 are based on calculated and/or simulated and/or empirically tested data, which relate to thermal effects on material, mechanical, structural, electrical and/or operational properties and conditions characteristic thereof. The design specifications identify limits for temperature levels, corresponding magnitudes of thermal energy content, and set threshold values related thereto for the switches 12.

Normal operational conditions include, e.g., steady state operations and transient operations. Other than normal operational conditions include operations that risk stress to the IC device 10 and one or more of its switches 12 related to over-temperature and corresponding thermal transients. Other than normal operational conditions include, e.g., successful and unsuccessful powerups, inrush currents related to the powerups and capacitive loading, and faults, such as overloads of various levels and durations and short circuit events.

The system 300 includes an actuator 350 coupled to the integrator 340 and operable to compare the computed integral with a threshold value. Upon the computed integral 325 exceeding the threshold value, an action is initiated in relation to shutting down a port of the IC device 10 corresponding to the one of the switches 12 for which the computed integral exceeds the threshold value. The switch 12 for which the computed integral exceeds the threshold value is thus placed into a substantially non-conductive state.

The threshold value 389 corresponds to a 'port disconnection' threshold, and is read from the storage 320. The port disconnection threshold relates to a physical capability of the switches 12 to withstand a predetermined and/or simulated and/or empirically tested total amount of thermal energy at any point in time.

Upon the integrated output 325 exceeding the threshold value, the actuator 350 initiates an action related to shutting down the related switch 12 of the IC device 10 with a corresponding 'Open Switch' actuation signal 355. The actuation signal 355 is operable specifically in relation to the particular one of the switches 12 affected by the elevated temperature and corresponding excessive thermal energy level. The affected switch 12 is thus placed into a substantially non-conductive state, which interrupts the electric current flow there through and related further generation of related heat and corresponding temperature rise. Similarly, in an example where the components of interest are not switches, actuator 350 initiates an action related to shutting down the flow of current through the respective component for which the integrated output 325 exceeds the threshold value 389.

In an example implementation, the actuator 350 and, e.g., one or more other components of the thermal protection system 300, are disposed within the control unit 14. The actuator 350 is coupled with each of the switches 12 in the active region 15, or actuation signal 355 may be fed to a control mechanism of control unit 14 to trigger the opening of the respective switch 12.

Figure 4:
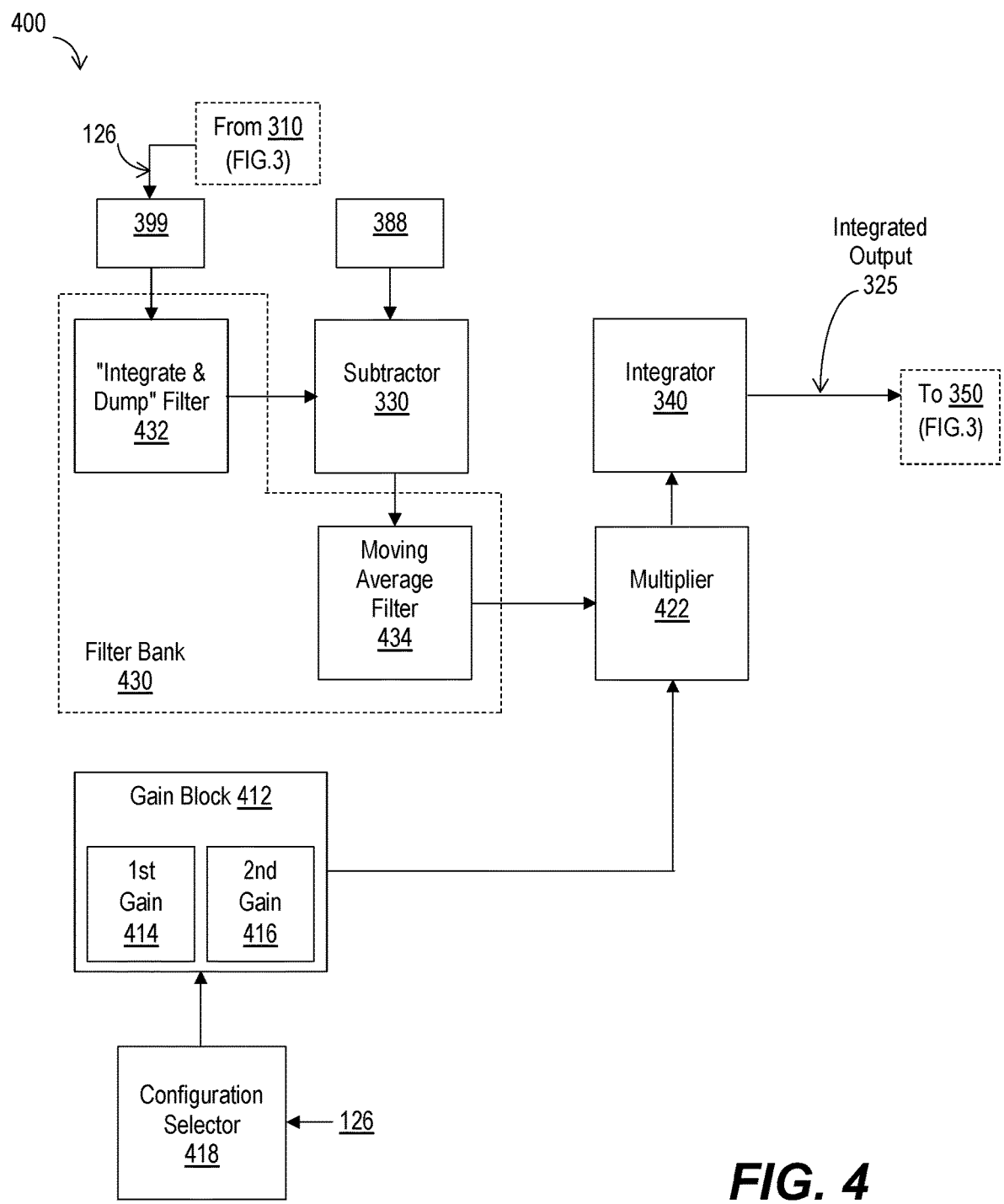
FIG. 4 depicts an example implementation of the thermal protection system.

FIG. 4 depicts an example of portions of thermal protection system 400. System 400 includes a filter bank 430 and may represent an alternative implementation of the thermal protection system 300, and includes one or more filters. In an example implementation, the sampler 399 is coupled to filter bank 430. In an example implementation, the filter bank 430 has an 'integrate-and-dump' filter 432, and a moving average filter 434. While the present examples use an integrate-and-dump filter 432 in combination with a moving average filter 434 in filter bank 430, this is not meant to be limiting in any way. Filter bank 430 may comprise a single filter without exceeding the scope.

As explained with reference to FIG. 3 above, the at least one processing component includes the subtractor 330, which may be placed in different locations in the processing without limitation.

FIG. 4 depicts a particular alternate implementation, in which the at least one processing component also includes the integrate-and-dump filter 432 coupled to the sampler 399. The processing includes filtering the sampled temperature output signal in relation to an integrate-and-dump function. The integrate-and-dump function receives a first set of discrete sampled temperature values and outputs the integral thereof. It then sets the sum to zero and receives a second set of discrete sampled temperature values and outputs the integral thereof.

In an example implementation, integrate-and-dump filter 432 is coupled between the sampler 399 and the subtractor 330. Alternatively, the subtractor 330 is arranged between the sample and the integrate-and-dump filter 432, or after moving average filter 434, or after multiplier 422.

In the example shown in FIG. 4, the integrate-and-dump filter 432 is operable to reduce the number of samples fed to subtractor 330, by integrating a fixed number of received discrete sampled temperatures, outputting the integrated result (which, in one example, is divided by the number of samples in the integrations window) to subtractor 330, and resetting integrate-and-dump filter 432. In the present implementation, the processing performed by the at least one processing unit thus includes the subtractor 330 subtracting the reference temperature value from each of the smaller number of filtered discrete sample temperatures, which are provided thereto by the integrate-and-dump filter 432 for the computation of the corresponding sequence of temperature differences.

In an example implementation of the system 400, the filter bank 430 further includes a moving average filter 434 coupled to the subtractor 330. The moving average filter 434 is operable to filter the sequence of temperature differences so as to computing a moving average value thereof over time.

For example, the moving averaging filter 434 is operable to filter the sequence of temperature differences output by subtractor 330 by computing a moving average value thereof over a predetermined trailing number of samples, or time period. The moving average filter 434 is further operable to provide a signal, which corresponds to the computed moving average value of the sequence of temperature differences filtered therewith. Those skilled in the art will recognize that output rate of the moving average filter may be equal to the input rate.

The system 400 further includes a multiplier 422 whose output coupled to the input of the integrator 340. The multiplier 422 is operable with a gain factor.

In another example, the multiplier 422 is coupled to an output of the integrator 340. In yet another example, multiplier 422 is not provided. In yet another example, a comparison is made between the output of filter bank 430 and a predetermined threshold, and in such an example actuator 350 is responsive to the comparison.

In an example implementation, the integrator 340 is not periodically reset. As such, the temperature effects of heating up, as well as cooling down, are essentially averaged by the integrator 340 over the entire time period, from initial startup to the present time. In an alternative example, the integrator 340 may be implemented as resettable, either periodically or responsive to pre-determined conditions.

The gain factor is selectable from at least two configurable gain factors, which are stored persistently and robustly in a gain block 412 and selected by a configuration selector 418 which configuration selector 418 based on the temperature sense output signal 126. The at least two configurable gain factors include one or more first gain factors 414 selected in relation to a normal operation of the IC device 10. The at least two configurable gain values also include a second gain factor 416 selected in relation to an other-than-normal operation of the IC device. While only two gain factors are described herein, additional gain factors may be provided without exceeding the scope. Thus, in the event that temperature sense output signal 126 indicates an excessive temperature, configuration selector 418 may select second gain factor 416, which is significantly greater than first gain factor 414, resulting in rapid action of actuator 350. Alternatively, in the event that temperature sense output signal 126 indicates an excessive temperature, actuator 350 may be directly signaled.

The output of multiplier 422 is coupled to the integrator 340. The integrator 340 computes the integrated output 325 based upon the product of the moving average signal and the gain factor. As described above, the integrated output 325 is fed to actuator 350 (not shown), which compares the integrated output 325 with the threshold value, and if the integrated output 325 exceeds the threshold value, the actuator 350 initiates an action related to shutting down the related switch 12 of the IC device 10 with a corresponding 'Open Switch' actuation signal 355.

Conformance with its design specifications is significant in relation to operational performance of the IC device 10, its switches 12, and their stable, effective, efficient and safe operability. In contrast, nonconformance with its design specifications risks deviation from expected standards of its operational performance and operability. For example, nonconformance with its design specifications contributes, potentially, to under-performance or operational failure of the IC device 10 and its switches 12.

Moreover, the degree of such nonconformance correlates, potentially, with a degree of the deviation from the operability and performance standards expected of the IC device 10 and its switches 12. For example, the magnitude of accumulated thermal energy content corresponding to exceeding a particular temperature limitation over time prescribed in its design specification for more than a period of time defined therein as allowable, contributes, potentially, to deterioration, degradation, damage and/or destruction of the IC device 10 and its switches 12.

In an example implementation therefore, the gain block 412 includes one or more other gain factors, which correspond to various temperature levels higher than those associated with the first gain factor 414, but lower than the excessive temperature values corresponding to the second gain factor 416. The configuration selector 418 is operable for selecting the intermediate gain settings in a piecewise fashion, based on a changing level of the temperature signal 126. In an example implementation, the gain values are selectable based on whether the temperature signal 126 is increasing or decreasing. Different gain factors may be implemented for rising and falling temperatures respectively, thus enabling independent control of the rate of heating and cooling with respect to the IC device behavior.

In an example implementation, the configuration selector 418 is coupled to the gain block 412 and operable, based on a level of the temperature output signal 126, for selecting the first gain factor 414 or the second gain factor 416. The configuration selector 418 selects the first gain factor 414 in relation to a normal operation of the switches 12.

During normal operation, the temperature (and other) characteristics of the switches 12 typically conform to levels well within its design specifications and thus, do not exceed boundaries prescribed therein. For example, normal operations typically relate to achieving a steady state (or mildly fluctuating) temperature within the design specifications of the switches 12. Normal operations potentially also relate to a rising temperature or to a falling temperature thereof, at rates and to levels that conform to the design specifications.

The magnitude of the second gain factor 416 exceeds that of the first gain factor 414. In an example implementation, the magnitude of the second gain factor 416 exceeds that of the first gain factor 414 by a factor of at least 100. Upon the level of the temperature signal 126 exceeding a maximum allowable temperature value '$T_{MAX}$' prescribed by the design specifications, the configuration selector 418 selects the second gain factor 416.

With the second gain factor 416 selected by configuration selector 418, the multiplier 422 becomes operable for computing the product of the output of filter bank 430, e.g., the output of moving average 434 and the second gain factor 416. A correspondingly greater product is computed with the second gain factor 416 selected, than with the first gain factor 414.

The correspondingly higher integrated output 325 from the multiplier 422 allows the actuator component 350 to more rapidly and/or robustly initiate its rapid thermal protection response. In an example implementation, the actuator actuation signal 355 is operable on the affected switch 12 to set the gate of the power MOSFET of switch 12 to low, which forces it into a non-conductive state. The affected switch 12 thus opens, which stops current flow and related heating and concomitant temperature rise.

The thermal protection system 300 and its alternative (or additional) implementation 400 are deployable operationally on an IC platform. In an example implementation, the thermal protection system 300 is disposed on the IC device 10 as described with reference to FIG. 8A and FIG. 8B, below. Moreover, the thermal protection systems 300 and 400 are each operable to perform a thermal protection process for the IC device 10. In example implementations, the process relates to a method of providing thermal protection described with reference to FIG. 5, FIG. 6 and FIG. 7, below.

Example IC Thermal Protection Methods

As described above, the IC device 10 has one or more components, such as switches 12. Each of the switches 12 functions as a port of the IC device 10. Each of the switches 12 is thus operable, upon being gated into a conductive state, for conducting an electrical current into or out of the IC device 10. Each of the switches 12 includes a power MOSFET, which may include multiple fingers.

Each of the methods described herein has a series, sequence or array of steps or blocks ("steps") related to providing thermal protection for the IC device 10. FIG. 5 is a flowchart of an example method 500 for implementing thermal protection for an IC device, such as the IC device 10.

In a step 510, for each component of the IC device 10 for which thermal protection is desired, one or more temperatures is sensed, each associated with a different area of the respective component, and for each of the components, an indication of the highest sensed temperature of the plurality of sensed temperatures is output.

In a step 520, for each of the components, the temperature output signal is sampled over each of a plurality of sequential instants to produce a sequence of discrete sampled temperature values.

In an example implementation, the sampling of the temperature output signal is performed continuously and/or at a fixed rate. It should be understood however that this implementation is not to be construed as limiting in any way, and in alternate or additional implementations, the temperature output signal is sampled periodically, occasionally or randomly and/or at other than a fixed rate.

In a step 530, a sequence of differences between a reference temperature value and each of the discrete sample temperatures is integrated, with respect to time, so as to compute an integral for each of the components. The corresponding integral is thus computed as described with reference to Equation 1, above.

In a step 540, the computed integral is compared to a threshold value. If the computed integral is below the threshold, then the process 500 proceeds according to a step 550, in which the process 500 feeds back to the step 510, recursively. If, however, the computed integral meets or exceeds the threshold, then the process 500 proceeds according to a step 560, which is described below.

As discussed above, the threshold value relates to a physical capability of the component to withstand a predetermined and/or simulated and/or empirically tested total amount of energy at any point in (or over a duration of) time. The threshold value is based on design, testing, fabrication and/or operational characteristics of the IC device 10.

Upon the integration output 325 meeting or exceeding the threshold however, an action is initiated in a step 560, which relates to the thermal protection function. The action taken in step 560 may include shutting down a port of the IC device 10 corresponding to the component for which the integral has met or exceeded the threshold, which is placed into a substantially non-conductive state. In an example implementation, shutting down the port relates to reducing the gate voltage to the affected switch 12. Becoming non-conductive, the electric current flow through the switch 12 effectively ceases, and additional current-related heating and corresponding temperature rise are thus deterred.

The production of heat is thus curtailed therein, and the temperature of the switch 12 (and other portions of the IC device 10 proximate thereto and affected by its heating) fall over time as it cools. The thermal protection function is thus achieved, because the IC device 10 is prevented from operating other than normally (and potentially unsafely), and the potential of thermal damage thereto is minimized.

It is to be noted that an example implementation continues to compute the integral described in relation to step 530 whether the sampled temperatures are above the threshold temperature value $T_{REF}$ or below the threshold temperature value $T_{REF}$. Thus, an example implementation is operable to represent effects of both heating, and of cooling, on the temperatures related to the IC device 10 with equal weight.

Figure 6:
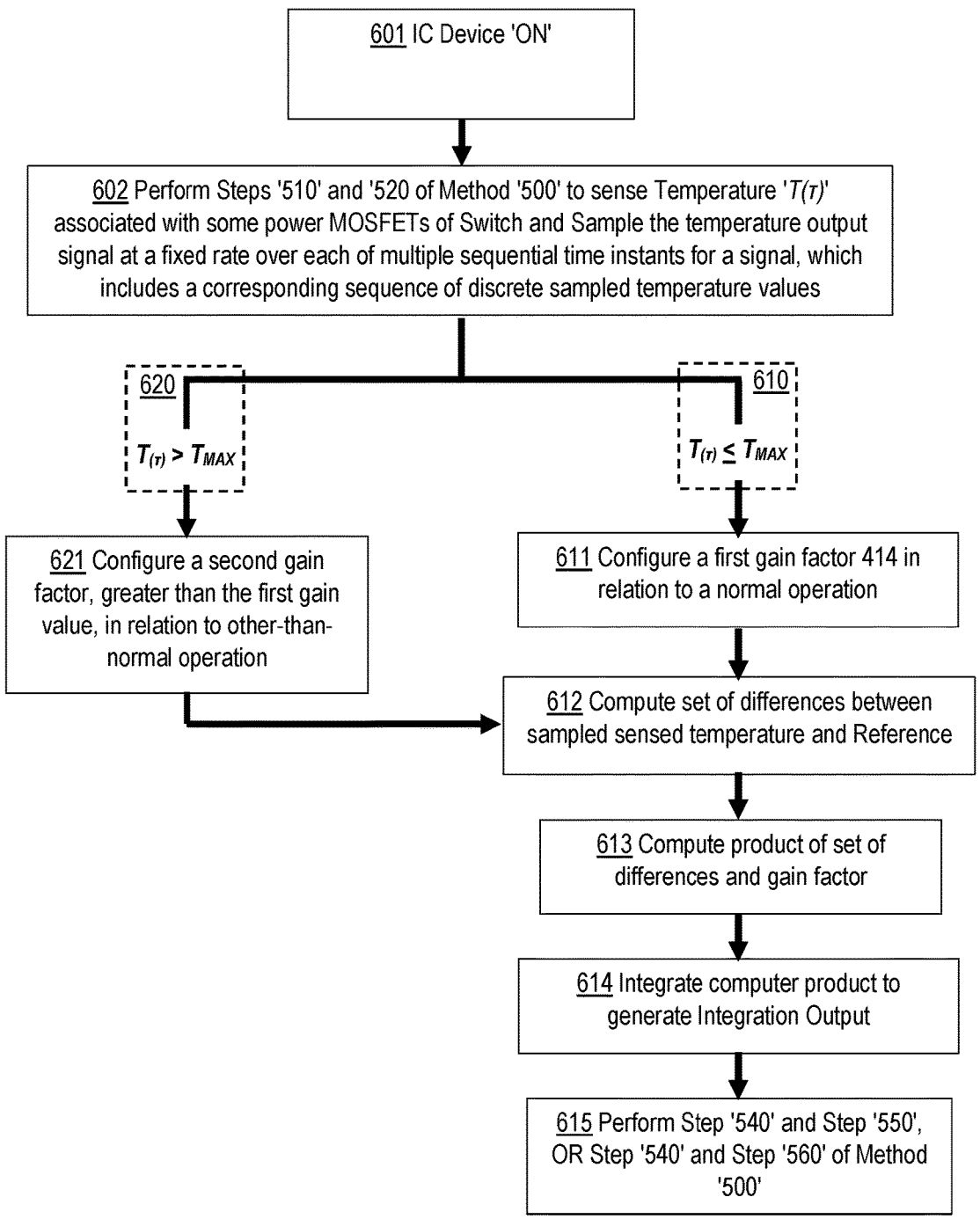
FIG. 6 is a flowchart of an example method for configuring a gain value.

FIG. 6 is a flowchart of an example method 600 for configuring a gain value. In a step 601, the IC device 10 is turned on, and at least one port of the IC device 10 is enabled. For example, a gate voltage applied to a switch 12 places the switch 12 into a conductive state and allows current to flow through its junctions.

In a step 602, the steps '510' and '520' of method '500' are performed, to sense the temperatures 'T(τ)' associated, individually, with the components for which thermal protection is desired, such as the power MOSFETs of switches 12, and to sample the temperature output signal over each of multiple sequential time instants. A corresponding output signal, i.e., a sampled temperature sense output signal, corresponding to these steps for each of the components includes a corresponding sequence of discrete sampled temperature values.

For each of the components, the temperatures $T_{(\tau)}$ are sensed per the step 510 of the method 500, described with reference to FIG. 5, above and sampled over each of multiple sequential time instants. If the sample temperature sense output signal corresponding to a component, such as switch 12, does not exceed (is less than or equal to) a maximum allowable operating temperature '$T_{MAX}$', then the method 600 proceeds along a first prong 610 in relation to the component.

Under the first prong 610, a step 611 is performed for each of the components, in which a first gain factor is selected. The first gain factor 414 is read from a configurable gain block, as described with reference to FIG. 4, above. As the sampled sensed temperature $T_{(\tau)}$ does not exceed the maximum allowed temperature $T_{MAX}$, the selection of the first gain factor 414 relates to a normal operation of the IC device 10.

In a step 612, a set of differences is computed between the sampled sensed temperatures $T_{(\tau)}$ and the reference value $T_{REF}$.

In step 613, a product of each of the computed set of differences and the gain factor is computed. Under the first prong 610, the first gain factor 414 is utilized for the step 613.

In a step 614, the product of the each of the computed set of differences and the gain factor is integrated to compute the integration output 325. The integration is according to Equation 1, above. The integrated differences described in relation to step '530' of the method '500' are thus computed. Under the first prong 610, the first gain factor 414 is utilized for the step 614.

In step 615, the method 600 continues with performance of the step '540' and '550', or alternatively, with step '540' and step '560' of the method '500' (FIG. 5), to compare the integration output with the threshold value. If the integration output 325 is below the threshold value, step 550 of the method '500' (FIG. 5) is performed. If the integration output 325 exceeds the threshold value however, the process 600, alternatively, continues with performance of the step '560' of the method '500'.

Under the steps of the prong 610, thermal protection is thus provided during normal operating conditions (and some other than normal operating conditions) of the IC device 10. During some other than normal operating conditions of an IC device 10, temperatures within an affected components may rise significantly, sometimes rapidly and/or suddenly, which sudden rise is handled under the steps of the prong 610.

If temperatures within an affected component exceed the maximum temperature '$T_{MAX}$' however, thermal protection is provided under a second prong 620.

In a step 621 of the second prong 620, a second gain factor 416 is selected, which is greater than the first gain factor 414.

In step 612, a set of differences is computed between the sampled sensed temperatures $T_{(\tau)}$ and the reference value $T_{REF}$.

In step 613, a product of each of the computed set of differences and the gain factor is computed. Under the second prong 620, the second gain factor 416 is utilized for the step 613.

In a step 614, the product of the each of the computed set of differences and the gain factor is integrated to compute the integration output 325. The integration is according to Equation 1, above. The integrated differences described in relation to step '530' of the method '500' are thus computed. Under the second prong 620, the second gain factor 416 is utilized for the step 614. As the second gain factor 416 exceeds the first gain factor 414, the integrated results computed therewith is greater than that computed with the first gain factor 414 and the corresponding integrated output 325 is thus greater. In an example implementation, the integrated output 325 corresponding to the greater product is potentially a faster, or prompter signal accessible to the actuator 350.

In step 615, the method 600 continues with performance of the step '540' and '550', or alternatively, with step '540' and step '560' of the method '500' (FIG. 5), to compare the integration output with the threshold value. If the integration output 325 is below the threshold value, step 550 of the method '500' (FIG. 5) is performed. If the integration output 325 exceeds the threshold value however, the process 600, alternatively, continues with performance of the step '560' of the method '500'.

Figure 7:
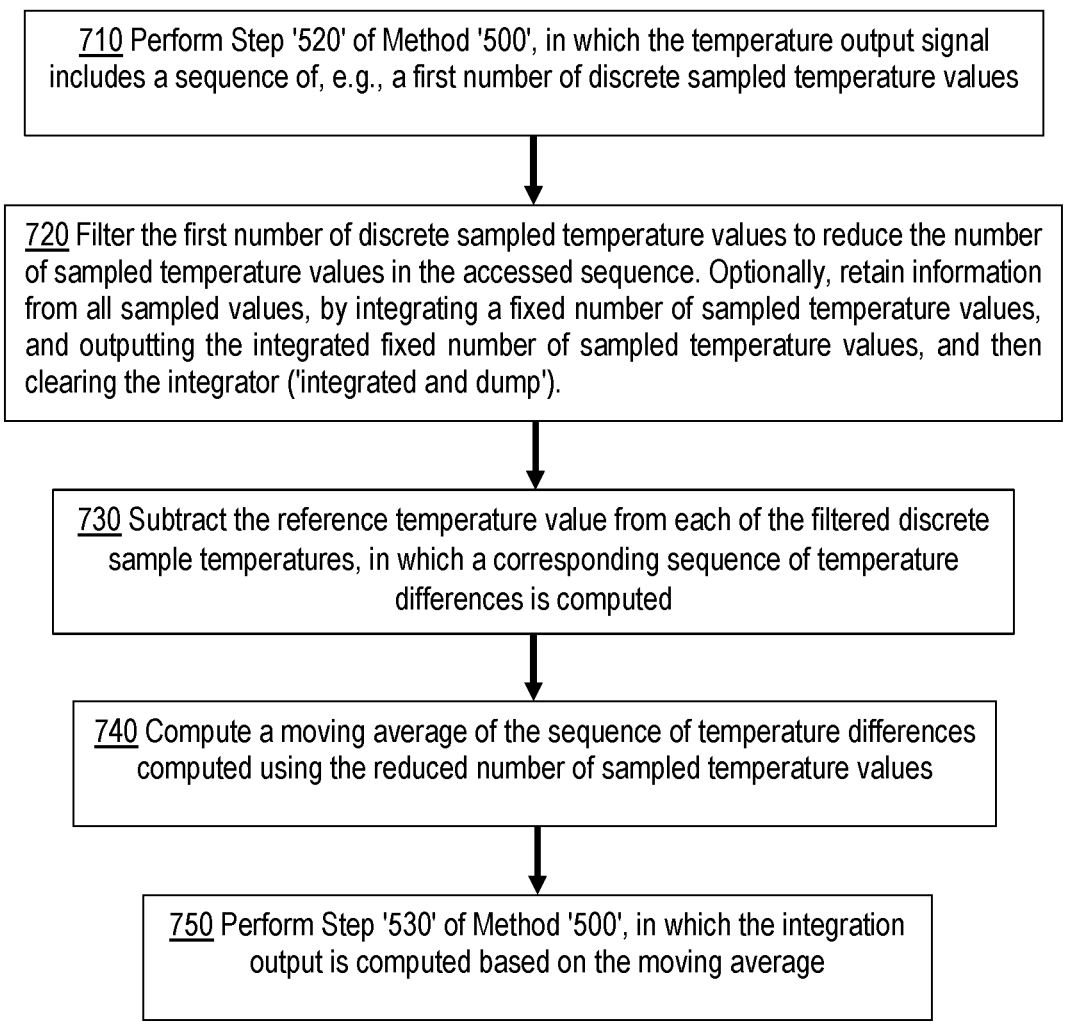
FIG. 7 is a flowchart of an example implementation of an IC thermal protection method with filtering.

In example implementations, providing thermal protection for an IC device 10 includes, e.g., optional, filter processes. FIG. 7 is a flowchart of an example method 700 for implementing an integration, with filtering.

In a step 710, the step '520' of the method '500' is performed, in which the temperature sense output signal 126 is sampled, as described with reference to FIG. 5, above. A sampled temperature sense output signal is generated, which includes a corresponding sequence of discrete, sampled temperature values.

In an optional step 720, the first number of discrete sampled temperature values is filtered to reduce the number of sampled temperature values in the accessed sequence of discrete sampled temperature values, thus reducing the output rate. Optionally, information from all sampled values is retained, by integrating a fixed number of the sampled temperature values, outputting the integrated fixed number of sampled temperature values, and then clearing the integrator ('integrated and dump'), thus reducing the output rate. The reference temperature value is thus subtracted from each of the filtered discrete sample temperatures, and in which the corresponding sequence of temperature differences is thus computed.

In a step 730, the sequence of temperature differences is computed using the optionally reduced number of temperature values.

In a step 740, filtering is performed. In one example, the filtering is a moving average filter. A filtered average of the sequence of temperature of the temperature differences is thus computed, using the optionally reduced number of sampled temperature values. In another example, a moving average filter, and the filtering thereof, may be done prior to the integrate and dump filter.

In a step 750, the step '530' of method '500' is performed. In an example implementation, the integration output 325 is thus computed based on the moving average.

In an example implementation, the method 700 is optional in whole or in part. For example, the steps 710, 720 and 730, and the steps 740 and 740 are optional in relation to each other.

In example implementations, one or more of the IC protection methods 500, 600 and 700 relate to processes performed by the thermal protection system 300, described with reference to one or more of FIG. 3 or FIG. 4, above. In an example implementation, the system 300 is disposed on the IC device 10, which is thus configured to perform a thermal protection function.

Example IC Device with Thermal Protection System

An example IC device 10 is described with reference to FIG. 1, above. An example thermal protection system 300 is described with reference to FIG. 3 and FIG. 4, above. In an example implementation, the system 300 is operable in relation to providing thermal protection for the IC device 10.

Figure 8A:
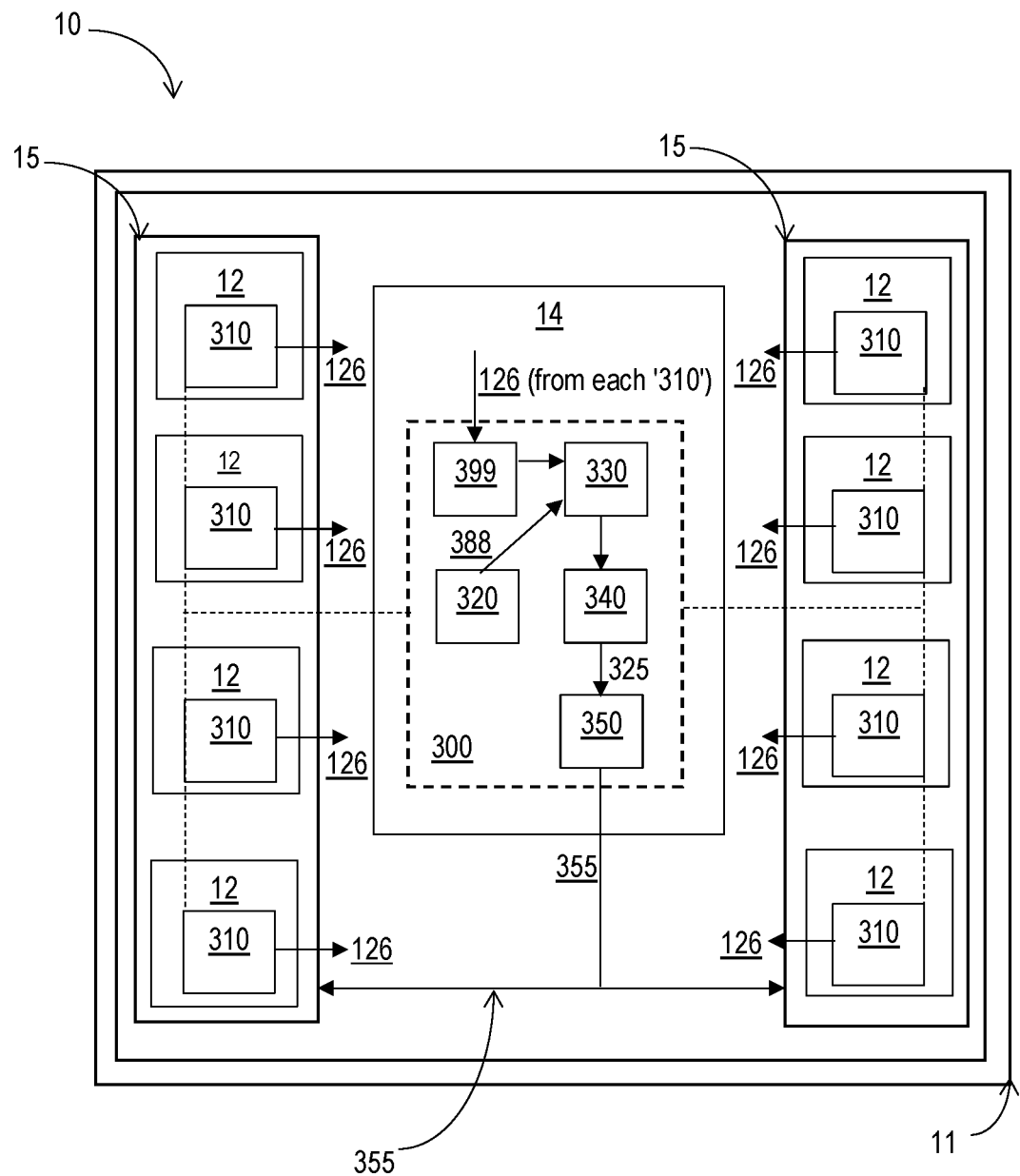
FIG. 8A depicts an example IC device, configured to perform a thermal protection function.

FIG. 8A depicts an example IC device 10, configured to perform a thermal protection function. Disposed upon the platform of the IC device 10, the system 300 is operable to perform the thermal protection functions for the IC device 10 according to one or more of the example processes described with reference to one of more of FIG. 5, FIG. 6 or FIG. 7, above.

The IC device 10 has a semiconductor die 11, as described with reference to FIG. 1, above. An active area 15 is disposed upon the die 11. The active area 15 has one or more switches 12, which each correspond to a port for controllably allowing a flow of electrical power in relation to the IC device 10. The switches 12 each have a respect power MOSFET.

A respective array 310 of temperature sensors is disposed within each of the switches 12. The array 310 is operable for sensing a temperature associated with at least an areas of the switch 12, and outputs a maximum temperature of the sensed temperatures of the array 310. In an example, the temperature sensors of each array 310 are coupled in parallel, the output from the array 310 corresponds to the highest temperature sensed in each of the switches 12.

In an example implementation, the sensed temperatures relate to a junction temperature of constituent MOSFETs of fingers of the power MOSFET of switch 12. In an example implementation, each array 310 is disposed in a respective one of the switches 12 and operable to output a temperature output signal 126, as described with reference to FIG. 2A and/or FIG. 2B, above. Thus, for each array 310, a temperature sense output signal 126 is received by a control unit 14.

Control unit 14 is disposed upon the semiconductor die 11. The control unit 14 is coupled to each of the arrays 310. The control unit 14 is operable for controlling the voltage applied to the gates of the power MOSFETs of each of the switches 12 and their corresponding conductivity states, independently of the voltage applied to the gates of the other switches 12. Thus, the control unit 14 controls each of the switches 12 in relation to the allowing of the flow of electrical power through the switches 12. A single control unit is described; however, this is not meant to be limiting in any way. In other examples, a separate control unit 14 is provided for each of the switches 12.

In addition, the control unit 14 is operable to provide a thermal protection function for the IC device 10. A portion of the thermal protection system 300 (apart from the arrays 310 in each of the switches 12) is disposed in the control unit 14. In example implementations, the thermal protection system 300 provides thermal protection to the IC device 10 as described with reference to FIG. 3 and/or FIG. 5, above.

For example, the sampler 399 is disposed within the control unit 14. The sampler 399 is operable for sampling the temperature output signal 126 from each of the arrays 310. The sampler 399 samples the temperature output signal 126 from each of the arrays 310 independently, relative to that of each of the other arrays 310.

The sampler 399 performs the sampling, optionally at a fixed rate. The sampler 399 outputs a sequence of corresponding sampled temperature values.

A subtractor 330 and a storage medium 320 are disposed within the control unit 14. The subtractor 330 is coupled to the sampler 399 and to the storage medium 320. The subtractor 330 is operable to read the reference temperature value 388 from the storage medium, subtract the reference temperature value 388 from each of the sampled temperature values and to output a sequence of corresponding temperature differences.

An integrator 340 is disposed in the control unit 14 and coupled to the subtractor 330. The integrator 340 is operable to integrate the sequence of corresponding temperature differences over time. In an example implementation, the integrator 340 computes the integral according to Equation 1, above. Upon computing the integral, the integrator 340 output a corresponding computed integral 325.

An actuator 350 is disposed in the control unit 14 and coupled to the integrator 340. The actuator 350 is operable to compare the computed integral 325 with a threshold value. Upon the computed integral 325 exceeding the threshold value, an action is initiated in relation to shutting down the respective switch 12 of the IC device 10. In an example, the actuator 350 sends an 'Open Switch' actuation signal 355 to the affected switch 12 so as to shut down the affected switch 12. The actuation signal 355 is effective to reduce the gate voltage provided to the Power MOSFET of the affected switch 12. The actuation signal 355 is operable specifically in relation to the particular one of the switches 12 affected by the elevated temperature and corresponding excessive thermal energy level.

The actuation signal 355 forces the affected switch 12 into a substantially non-conductive state, which effectively stops the current flow through the affected switch 12. Further current-related heating and corresponding temperature rise is thus deterred for the affected switch 12.

Figure 8B:
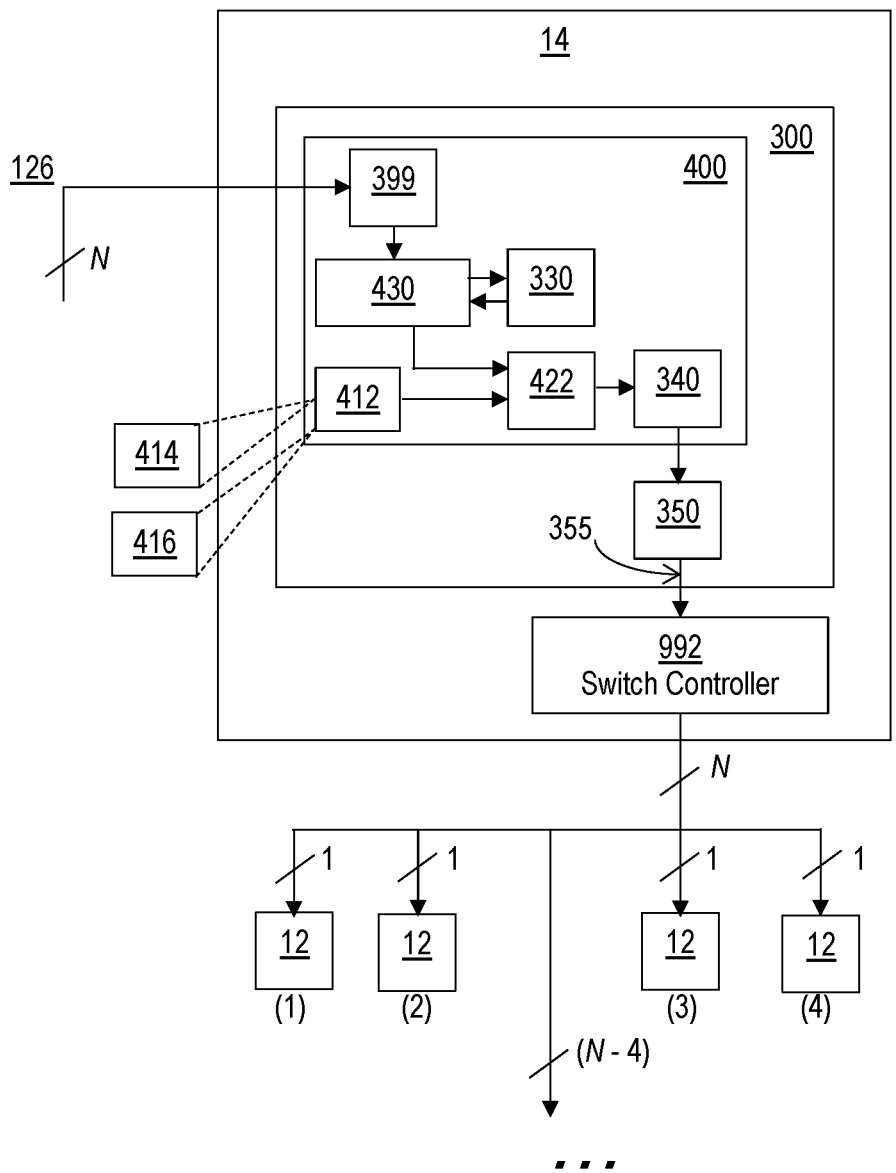
FIG. 8B depicts an example implementation of the IC device.

FIG. 8B depicts an example implementation of the IC device 10. In example implementations, the system 300 provides the thermal protection to the IC device 10 as described with reference to FIG. 3, FIG. 4, FIG. 5, FIG. 6, FIG. 7 and/or FIG. 8A, above. The thermal protection system 300 is disposed in the control unit 14.

In the implementation shown in FIG. 8B, an example implementation, the IC device 10 has a plurality 'N' of the switches 12; the number N is an integer greater than, or equal to, one. Four of the switches 12 are shown, labeled '1', '2', '3' and '4'. A number of the switches 'N-4' are represented for simplicity and brevity by the ellipsis below the four of the switches 12 depicted in FIG. 8B. In the implementation described above with reference to FIG. 8A for example, N equals 'eight' because the IC device 10 has eight of the switches 12.

The control unit 14 thus reads N of the temperature sense output signals 126, one corresponding individually to each of the switches 12. The sampler 399 (and other components of the system 300) process each of the individual temperature output signals 126 corresponding to each of the switches 12 independently.

In an example implementation, the thermal protection system 300 includes a filter bank 430. As described above with reference to FIG. 4, the filter bank 430 performs functions related to the integrate-and-dump filter 432 and/or the averaging filter 434, which are thus also disposed in the control unit 14.

The sampler 399 is disposed in the control unit 14 and coupled to the filter bank 430. In an example implementation, the sampler 399 is coupled to the integrate-and-dump filter 432, as described with reference to FIG. 4, above.

For example, the sampler 399 is operable to filter the sampled temperature output signal 126 in relation to an integrate-and-dump function. In an example implementation, the output of the integrate-and-dump function has a value related to a predetermined number of sampled temperature values from the sampler 399.

Upon performing the integrate-and-dump function, a reduced number of integrated samples is supplied in relation to the subtracting. In an example implementation, the moving average filter 434 coupled to the subtractor 330 is operable to filter the sequence of temperature differences in relation to computing a moving average value thereof over time.

In an example implementation, the system 300 includes a multiplier 422 coupled to the integrator 340. The multiplier is operable for computing a product of the moving average value and the gain factor. The gain factor is selected from at least two configurable gain factors.

The configurable gain factors include a first gain factor 414, which is selected in relation to a normal operation of the IC device 10. The configurable gain factors also include a second gain factor 416, which is selected in relation to an other-than-normal operation of the IC device 10.

The integrator 340 is coupled to the actuator 350. The control unit 14 has a switch controller 992. In an example implementation, the actuator 350 is disposed in the switch controller 992.

The switch controller 992 is operable to control the individual gate voltages to the power MOSFETs of the switches 12, and thus the conductivity state of each of the switches 12, independent of the others. The switch controller 992 is operable with the thermal protection system 300.

In an example implementation, portions of the switch controller 992 and the thermal protection system 300 overlap and/or occupy some of the same resources of the control unit 14. For example, in the implementation depicted in FIG. 8B, the output of actuator 350 is fed to the switch controller 992.

Switch controller 992 is coupled to each of the N switches 12. The actuator 350 is operable to instruct switch controller 992 to control the power MOSFET 95 gate voltage of each of the N individual switches, independently of the others.

An example implementation relates to a system for providing thermal protection for an IC device. An example implementation relates to an IC device having a system and/or components, units and/or elements thereof, which are operable for providing thermal protection for the IC device 10.

Thermal protection is provided for an IC device 10 with switches 12. A number of temperatures related to each of the switches 12 is sensed. A temperature output signal 126 corresponds to the highest sensed temperature of each of the switches 12. The temperature output signal 126 from each of the switches 12 is sampled to generate a sequence of discrete sampled temperature values. A reference temperature value 388 is subtracted from each of the discrete sample temperatures. A corresponding sequence of temperature differences is computed. Each of the temperature differences is integrated over time. A corresponding integral 325 is computed. The computed integral is compared with a threshold value. Upon exceeding the threshold value, a respective switch 12 is rendered substantially non-conductive.

Example implementations relate to a system and methods for providing thermal protection for an IC device 10. An example implementation relates to an IC device 10 having a system and/or components, units and/or elements thereof, which are operable for providing thermal protection for the IC device 10.

For clarity and brevity, as well as to avoid unnecessary or unhelpful cluttering, obfuscating, obscuring, obstructing, or occluding features or elements of an example of the disclosure, certain intricacies and details, which are known generally to artisans of ordinary skill in related technologies, have been omitted or discussed in less than exhaustive detail. Any such omissions or discussions are deemed unnecessary for describing examples of the disclosure, and/or not particularly relevant to achieving an understanding of significant features, functions, elements and/or aspects of the examples of the disclosure described herein.

The term "or" is used herein in an inclusive, and not exclusory sense (unless stated expressly to the contrary in a particular instance), and use of the term "and/or" herein includes any and all combinations of one or more of the associated listed items, which are conjoined/disjoined therewith. Within the present description, the term "include," and its plural form "includes" (and/or, in some contexts the term "have," and its conjugate "has") are respectively used in same sense as the terms "comprise" and "comprises" are used in the claims set forth below, any amendments thereto that are potentially presentable, and their equivalents and alternatives, and/or are thus intended to be understood as essentially synonymous therewith. The figures are schematic, diagrammatic, symbolic and/or flow-related representations and so, are not necessarily drawn to scale unless expressly noted to the contrary herein. Unless otherwise noted explicitly to the contrary in relation to any particular usage, specific terms used herein are intended to be understood as in a generic and/or descriptive sense, and not for any purpose of limitation.

In the specification and figures herein, examples implementations are thus described in relation to the claims set forth below. The present disclosure is not limited to such examples however, and the specification and figures herein are thus intended to enlighten artisans of ordinary skill in technologies related to integrated circuits in relation to appreciation, apprehension and suggestion of alternatives and equivalents thereto.

What is claimed, is:

1. A method of providing a thermal protection function for an integrated circuit (IC) device that comprises a plurality of components, the method comprising:
    sensing, for respective components, one or more temperatures, respective ones of the one or more temperatures associated with a different area of the respective component, and outputting for respective components a respective temperature sense output signal indicative of the highest sensed temperature of the plurality of sensed temperatures of the respective component;
    sampling, for respective ones of the components, the respective temperature sense output signal to produce a sequence of discrete sampled temperature values;
    integrating, over time, a sequence of differences between a reference temperature value and respective discrete sampled temperature values to compute, for respective components, a respective integration output;
    comparing the respective integration output to a threshold value; and
    initiating an action related to the thermal protection function upon the integration output of an affected one of the components exceeding the threshold value.

2. The method as described in claim 1, comprising computing the sequence of differences between the reference temperature value and respective discrete sampled temperature values.

3. The method as described in claim 2, comprising filtering at least one of the discrete sampled temperature values or the sequence of differences between the reference temperature value and respective discrete sampled temperature values.

4. The method as described in claim 3, wherein the filtering comprises filtering the discrete sampled temperature values by an integrate-and-dump function.

5. The method as described in claim 3, wherein the filtering comprises filtering the sequence of differences between the reference temperature value and respective discrete sampled temperature values by computing a moving average.

6. The method as described in claim 1 wherein the integrating the sequence of differences comprises computing a product of the sequence of differences between the reference temperature value and respective discrete sampled temperature values and a gain factor, wherein the computed product is integrated over time, to thereby integrate the sequence of differences between the reference temperature value and respective discrete sampled temperature values.

7. The method as described in claim 6, comprising selecting the gain factor from at least two configurable gain factors.

8. The method described in claim 7 wherein the at least two configurable gain factors comprise:
    a first gain factor selected in relation to a normal operation of the IC device; and
    a second gain factor selected in relation to an other than normal operation of the IC device, the second gain factor greater than the first gain factor.

9. The method as described in claim 1, wherein the plurality of components comprise power MOSFET switches, and wherein the action comprises placing the affected power MOSFET switch into a substantially non-conductive state.

10. A system for an integrated circuit (IC) device comprising a plurality of components, the system comprising:
    an array of temperature sensors disposed within respective ones of the plurality of components to sense, for each of the components, one or more temperatures, respective ones of the one or more temperatures associated with a different area of a respective component, and to output for respective ones of the components a temperature sense output signal indicative of the highest sensed temperature of the plurality of sensed temperatures;
    a sampler coupled to the array of temperature sensors to sample, for respective ones of the one or more components, the temperature sense output signal to produce a sequence of discrete sampled temperature values;
    an integrator to integrate, over time, a sequence of differences between a reference temperature value and respective discrete sampled temperature values to compute an integration output for respective components; and
    an actuator to compare the integration output computed for respective components to a threshold value, and, upon the integration output of an affected one of the components exceeding the threshold value, to place the affected component into a substantially non-conductive state.

11. The system as described in claim 10 comprising a subtractor disposed between the sampler and the integrator to compute the sequence of differences between the reference temperature value and respective discrete sampled temperature values.

12. The system as described in claim 11, comprising a filter bank to filter at least one of the sequence of discrete sampled temperature values and the sequence of differences between the reference temperature value and respective discrete sampled temperature values.

13. The system as described in claim 12, wherein the filter bank comprises an integrate-and-dump filter coupled to the sampler and the subtractor to filter the sampled temperature output signal in relation to an integrate-and-dump function.

14. The system as described in claim 12, wherein the filter bank comprises a moving average filter coupled to the subtractor and is to filter the sequence of differences in relation to computing a moving average value thereof.

15. The system as described in claim 10, comprising a multiplier coupled to the integrator, to compute a product of the sequence of differences between the reference temperature value and respective discrete sampled temperature values and a gain factor, wherein the integration over time of the sequence of differences is of the computed product.

16. The system as described in claim 15, comprising a configurable gain block coupled to the multiplier to store at least two configurable gain factors, which are selectively readable by the multiplier.

17. The system as described in claim 16 wherein the at least two configurable gain factors comprise:
a first gain factor selected in relation to a normal operation of the IC device; and
a second gain factor selected in relation to an other than normal operation of the IC device, the second gain factor greater than the first gain factor.

18. An integrated circuit (IC) device, comprising:
a semiconductor die;
an active area disposed upon the die and comprising one or more Power Metal Oxide Semiconductor Field Effect Transistor (Power MOSFET) based switches;
an array of temperature sensors disposed within respective Power MOSFET based switches to sense a temperature of the switch in proximity thereto, and to output a temperature sense output signal corresponding to a highest temperature sensed within the switch; and
a control unit disposed upon the die, coupled to the temperature sensor array to control respective switches in relation to the allowing of the flow of electrical power through the IC device and to provide a thermal protection function related thereto, the control unit comprising:
a sampler coupled to the array of temperature sensors to sample, for respective switches, the temperature output signal to produce a sequence of discrete sampled temperature values;
an integrator to integrate, over time, a sequence of differences between a reference temperature value and respective discrete sampled temperature values to compute an integration output for respective switches; and
an actuator to compare the integration output computed for respective switches to a threshold value, and, upon the integration output of an affected one of the switches exceeding the threshold value, to initiate an action related to the thermal protection function, wherein a port of the IC device corresponding to the affected switch is shut down by placing the affected switch into a substantially non-conductive state.

19. The IC device as described in claim 18 wherein the control unit comprises a subtractor disposed between the sampler and the integrator to compute the sequence of differences between the reference temperature value and respective discrete sampled temperature values.

20. The IC device as described in claim 19 wherein the control unit comprises an integrate-and-dump filter coupled to the sampler and the subtractor.

21. The IC device as described in claim 18, comprising a multiplier coupled to the integrator and a gain block with a gain factor readable therefrom, the multiplier to compute a product of the sequence of differences between the reference temperature value and respective discrete sampled temperature values and the gain factor wherein the integrator is to integrate, over time, the computed product to compute the integrated output.

22. The IC device as described in claim 21, wherein the gain block is configurable and coupled to the multiplier the gain block to store at least two configurable gain factors, which are selectively readable by the multiplier.

23. The IC device as described in claim 22 wherein the at least two configurable gain factors comprise:
a first gain factor selected in relation to a normal operation of the IC device; and
a second gain factor selected in relation to an other than normal operation of the IC device).

24. The IC device as described in claim 18 wherein the control unit further comprises a moving average filter disposed in a filter bank to filter the sequence of differences in relation to computing a moving average value thereof.

* * * * *